(12) United States Patent
Ujazdowski et al.

(10) Patent No.: US 6,661,826 B2
(45) Date of Patent: *Dec. 9, 2003

(54) LASER CHAMBER INSULATOR WITH SEALED ELECTRODE FEEDTHROUGH

(75) Inventors: Richard C. Ujazdowski, San Diego, CA (US); Timothy S. Dyer, Oceanside, CA (US); William N. Partlo, Poway, CA (US); Michael Altheim, Temecula, CA (US); Brian Strate, San Diego, CA (US); Thomas Hofmann, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/164,885

(22) Filed: Jun. 7, 2002

(65) Prior Publication Data

US 2002/0196830 A1 Dec. 26, 2002

Related U.S. Application Data

(63) Continuation-in-part of application No. 09/451,750, filed on Nov. 30, 1999, which is a continuation-in-part of application No. 09/386,938, filed on Aug. 31, 1999, now Pat. No. 6,208,674.

(51) Int. Cl.⁷ .............................................. H01S 3/223
(52) U.S. Cl. .......................................... 372/55; 372/57
(58) Field of Search ..................................... 372/55, 57

(56) References Cited

U.S. PATENT DOCUMENTS

| | | | | | |
|---|---|---|---|---|---|
| 4,959,840 | A | * | 9/1990 | Akins et al. | 372/57 |
| 5,719,896 | A | * | 2/1998 | Watson | 372/86 |
| 6,102,728 | A | * | 8/2000 | Shinchi | 439/397 |
| 6,208,674 | B1 | * | 3/2001 | Webb et al. | 372/57 |

* cited by examiner

*Primary Examiner*—Paul Ip
*Assistant Examiner*—Phillip Nguyen
(74) *Attorney, Agent, or Firm*—William Cray (57) ABSTRACT

A feedthrough structure of a gas discharge laser chamber conducts electric power through the wall of a sealed gas enclosure to a single piece elongated electrode inside the enclosure. The feedthrough structure includes a single piece integrated main insulator larger than the electrode. The main insulator is compressed between the electrode and the wall of the enclosure. The surfaces forming interfaces between the electrode and the single piece insulator are the insulator and the wall are all very smooth to permit the parts to expand and contract as the chamber temperature varies. The feedthrough structure also provides mechanical support and alignment for the electrode and includes seals to prevent gas leakage around the feedthrough structure.

20 Claims, 8 Drawing Sheets

LASER CHAMBER INSULATOR WITH SEALED ELECTRODE FEEDTHROUGH

This application is a continuation-in-part of U.S. Ser. No. 09/451,750 filed Nov. 30, 1999, "ArF Laser with Low Pulse Energy and High Rep-Rate which was a continuation-in-part of U.S. Ser. No. 09/386,938, filed Aug. 31, 1999, "Laser Chamber with Fully Integrated Electrode Feedthrough Main Insulator, now U.S. Pat. No. 6,208,674 B1, all of which are incorporated by reference herein. This invention relates to high-energy photon sources and in particular to highly reliable, high repetition rate x-ray and high-energy ultraviolet sources.

FIELD OF THE INVENTION

The present invention relates generally to laser chambers for excimer lasers and other electric discharge lasers and more particular to pulse high voltage feedthrough structures for such chambers.

BACKGROUND OF THE INVENTION

Figure 1A:
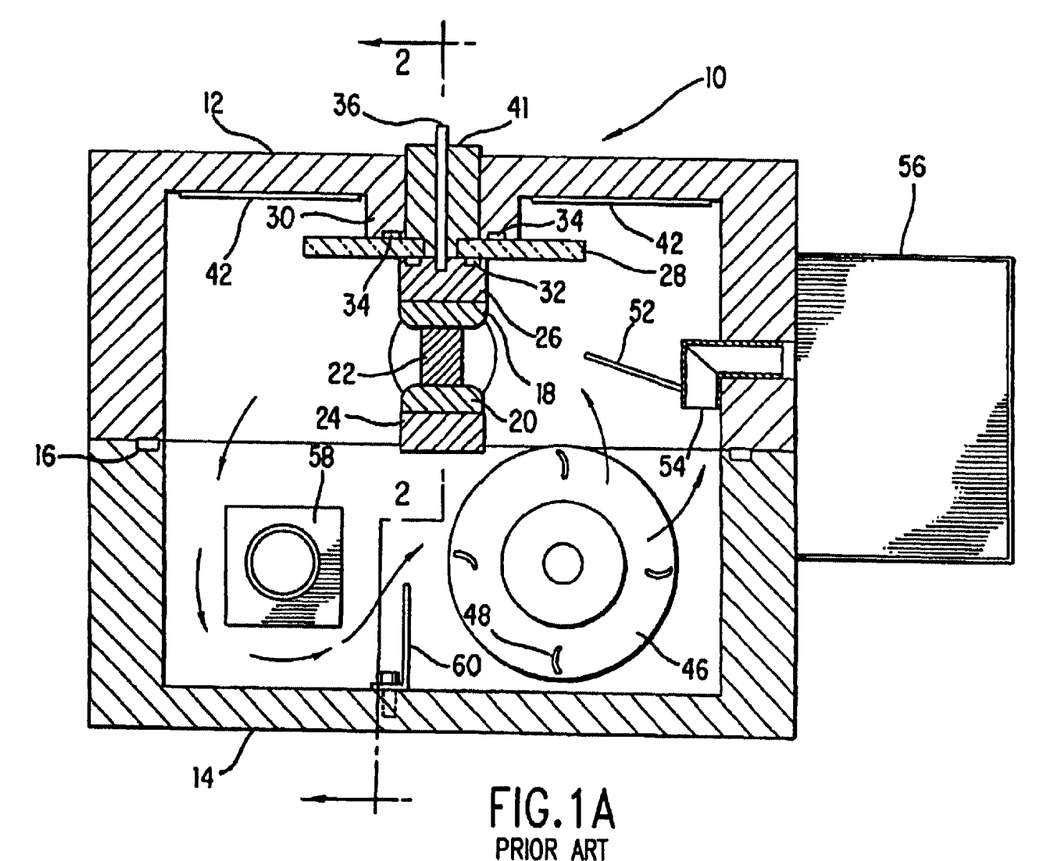
FIG. 1A is a cross-sectional end view showing the inner structure of a laser chamber 100 in a conventional TE excimer laser and a reproduction of FIG. 1 of the '840 patent.
Figure 1B:
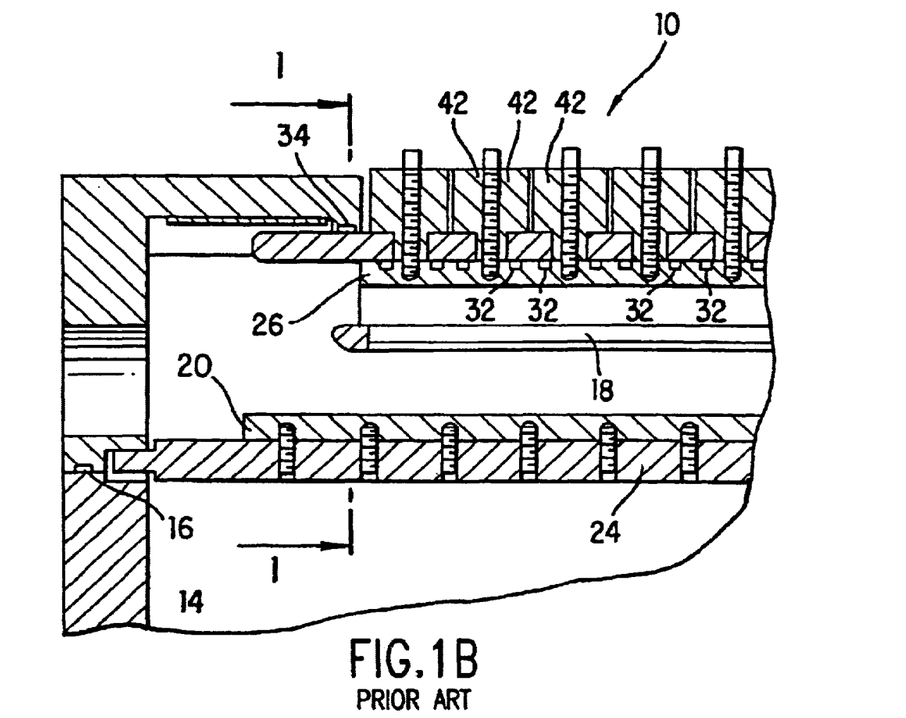
FIG. 1B is a chamber cross section and a reproduction of FIG. 2 of the '840 patent.
Figure 1C:
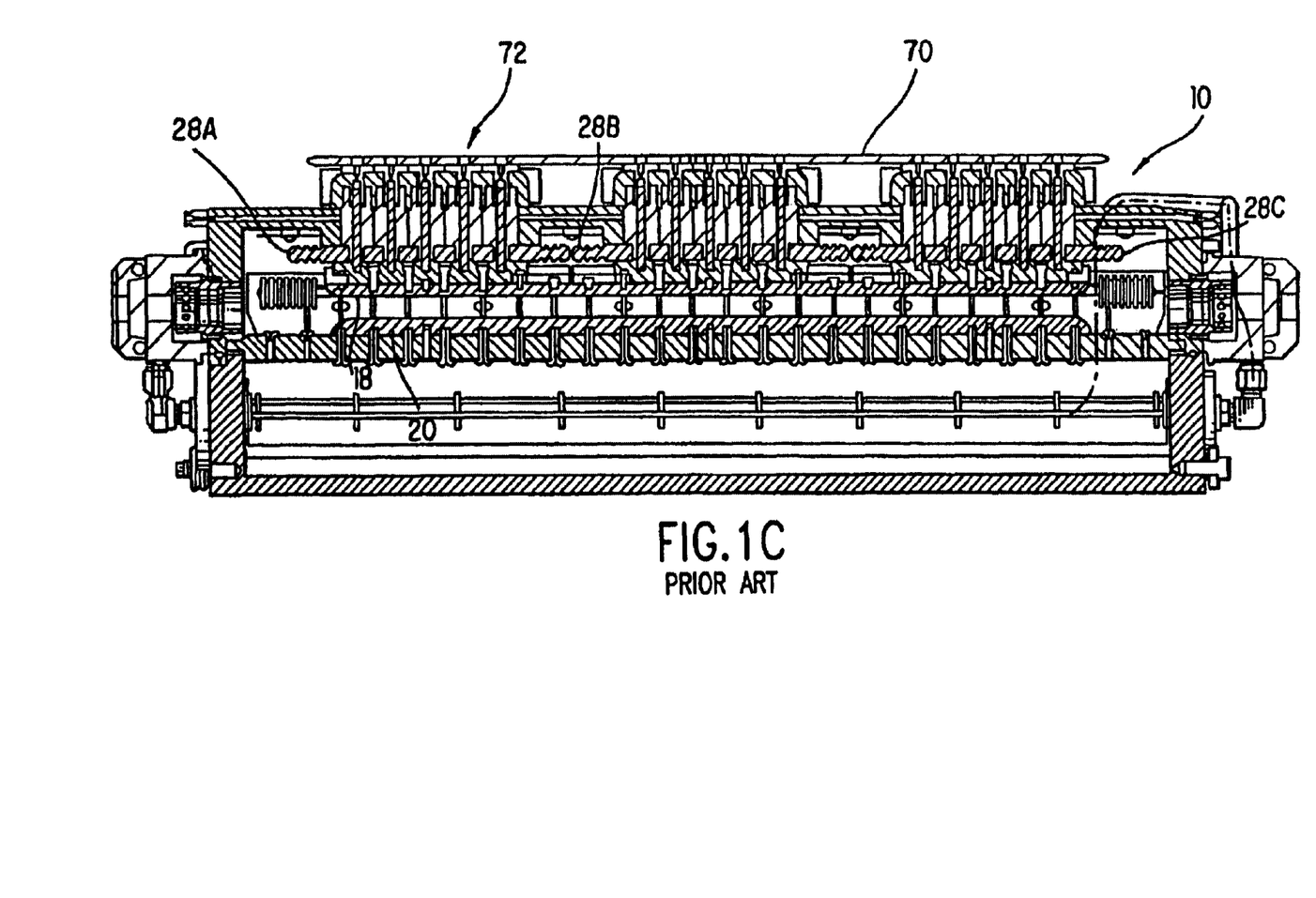
FIG. 1C is an expanded view similar to FIG. 1B but showing a cross section of the whole chamber.

FIGS. 1A and 1B are cross-sectional views showing the inner structure of a laser chamber 10 in a conventional transversely excited (TE) excimer laser (see Akins et al., U.S. Pat. No. 4,959,840, issued Sep. 25, 1990, and incorporated herein by reference in its entirety). FIGS. 1A and 1B are excerpts from the '840 patent. FIG. 1C is a cross section similar to FIG. 1B but showing the entire length of a prior art laser chamber. A laser enclosure 10 provides isolation between a laser chamber interior and the exterior. Typically enclosure 100 is formed by upper and lower enclosure members 12 and 14, which are coupled together and sealed using an o-ring seal 16, extending along a perimeter of enclosure 10. The laser chamber interior is filled to a predetermined pressure with a lasing gas mixture including the hazardous gas fluorine, $F_2$. A pulsed electric discharge is generated in the lasing gas mixture in a discharge region 22 by a high voltage pulse applied between a cathode assembly 18 and an anode assembly 20. Since anode assembly 20 is generally electrically grounded to laser enclosure 10, the entire pulse high voltage is applied between cathode assembly 18 and upper enclosure member 12. The pulsed gas discharge typically produces excited fluorine, argon fluoride or krypton fluoride molecules, which generate laser pulse output energy. The pulse output energy propagates from discharge region 22 through an optical output window assembly (not shown in FIG. 1A). Cathode assembly 18 and anode assembly 20, defining discharge region 22, and extend for about 28 inches substantially parallel to one another for most of the length of laser chamber 10 perpendicular to the plane of FIG. 1A.

Recirculation of the lasing gas mixture is provided by a tangential fan 46. As shown by arrows in FIG. 1A, the flow of lasing gas mixture is upward through tangential fan 46 and transversely across discharge region 22 as directed by a vane member 52. The lasing gas mixture that has flowed through discharge region 22 becomes dissociated and heated considerably by the pulsed gas discharge. A gas-to-liquid heat exchanger 58, extending substantially the length of laser chamber 10 perpendicular to the plane of FIG. 1A, is positioned in the gas recirculation path to cool the heated gas. Recirculation cools and recombines the lasing gas mixture, thereby allowing repetitively pulsed laser operation without replacing the lasing gas mixture.

In this prior art chamber high voltage pulses in the range of about 16 kv to 30 kv are applied to cathode 20 at repetition rates of about 1000 pulses per second from a high voltage bus 70 mounted on top of chamber 10 as shown in FIG. 1C. Bus 70 consists of a thin copper plate mounted on a ½ thick aluminum plate with rounded surfaces. (This aluminum plate is referred to as a "corona plate" since its purpose is to reduce or minimize corona discharge from the high voltage bus.) The bus is energized by a peaking capacitor bank typically consisting of 28 individual capacitors (not shown) mounted in parallel and electrically connected between bus 70 and the metal enclosure 10 which functions as ground. The high voltage pulses are transmitted to cathode 18 through a feedthrough structure consisting primarily of 15 feedthrough conductor assemblies 72 as shown in FIGS 1A, B and C.

Cathode 18 and each of the 15 feedthrough conductors carrying peak voltages in the range of 16 kv to 30 kv must be insulated from the metal surfaces of enclosure 10 which is at ground potential. Because of the corrosive $F_2$ environment inside the chamber only certain high purity ceramic insulators such as high purity $A_2lO_3$ can be used for the portion of the feedthrough assemblies exposed to the gas environment.

With a design of the type shown in FIGS. 1A, B and C ceramic parts 28 are sandwiched in between a brass part 32 and an aluminum part 12. The laser chamber is subject to temperature swings between normal ambient temperature of about 23° C. and temperature of about 120° C. The coefficients of thermal expansion of aluminum, brass and $A_2lO_3$ are about $23 \times 10^{-6}/°$ C., $20 \times 10^{-6}/°$ C. and $8 \times 10^{-6}/°$ C. respectively. The distance between the two end feedthroughs is about 22 inches. Therefore, in this distance a 100° C. temperature increase would produce unrestrained expansions of about 0.052 inch, 0.045 inch and 0.017 inch respectively for aluminum, brass and $AlO_2$. This makes a difference of about 1/32 inch between the ceramic and metal parts. It is important that good seals be provided for the feedthrough assemblies to prevent hazardous fluorine from escaping into the working environment.

The issues discussed above have been dealt with in the design of the laser portrayed in FIGS. 1A, B and C. This laser utilizes three main insulators 28A, 28B and 28C to insulate the cathode 18 from the chamber member 12. In this prior art design as shown in FIG. 1C, fifteen feedthrough connectors are separated into three separate groups so that the effective length of the sealed region of each of the resulting metal-ceramic-metal sandwiches is only about 6 inches. This reduces the differential expansion by a factor of about 3.5 as compared to a single piece insulator covering the entire electrode length. Sealing at the feedthroughs is provided by tin-plated, nickel-copper alloy "C" seals 32 and 34 as shown in FIGS. 1A and 1B. Seal 32 are circular seals making a seal around each of the 15 feedthroughs at the insulator 28, cathode support 26 interface. Each of three seals 34 make the seal between the bottom of upper chamber 12 and the top of one of the three insulator plates 28, each seal 34 providing a single seal around five feedthroughs.

In this prior art design, cathode support bar 26 is bolted to cathode 18. Threaded feedthrough rod 36 threads into cathode support bar 26. Feedthrough insulator 41 insulates rod 36 and a feedthrough nut (not shown in FIGS. 1A and 1B) is threaded onto feedthrough rod 36 and holds insulator 41 in place. A holddown bolt with a Belleville washer is passed through an insulator cap called a "buttercup" is then screwed into the feedthrough nut to apply a compressive force clamping the electrode support to the top inside wall of the chamber with insulator plate 28 and seals 34 and 32 sandwiched in between.

The prior art feedthrough designs shown in FIGS. 1A, B and C has been commercially very successful and is utilized in hundreds of excimer lasers currently operating around the world. The design is basically trouble-free with extremely minimal problems with leakage or electrical failure despite the harsh $F_2$ environment and in many cases continuous round-the-clock operation for weeks and months at a time.

However, the very large number of parts of the above described prior art design make the fabrication expensive. Also, a need exists for a reduction in the electrical inductance associated with the feedthrough design. Therefore a need exists for a better electrical feedthrough system for electric discharge lasers.

SUMMARY OF THE INVENTION

A feedthrough structure of a gas discharge laser chamber conducts electric power through the wall of a sealed gas enclosure to a single piece elongated electrode inside the enclosure. The feedthrough structure includes a single piece integrated main insulator larger than the electrode. The main insulator is compressed between the electrode and the wall of the enclosure. The surfaces forming interfaces between the electrode and the single piece insulator are the insulator and the wall are all very smooth to permit the parts to expand and contract as the chamber temperature varies. The feedthrough structure also provides mechanical support and alignment for the electrode and includes seals to prevent gas leakage around the feedthrough structure.

A plurality of hollow substantially cylindrical feedthrough insulators integral with the integrated main insulator extend from the upper surface of the integrated main insulator, typically in an evenly spaced row. Each integral feedthrough insulator contains a substantially concentric hole that extends through to the lower surface of the integrated main insulator and accommodates a feedthrough electrical conductor. In a preferred embodiment, each substantially cylindrical feedthrough insulator includes a concentric groove around its outer diameter. In some embodiments, the integrated main insulator is made of a ceramic material, typically 99.5 per cent purity alumina.

The integrated main insulator is clamped between a lower electrode and an upper inner wall of the sealed enclosure, such that the integral feedthrough insulators extend through aligned clearance holes in the enclosure wall. Clamping is typically provided by threading the lower end of the feedthrough electrical conductor into the electrode and tensioning the upper end against an insulating "buttercup" structure on the upper outer wall of the sealed enclosure. Relatively constant clamping forces are preferably provided using Belleville washers. To limit relative thermal expansion between the enclosure and the single piece main insulator the insulator is tightly restrained only at its center position permitting relative expansion and contraction only from its center.

Face seals are provided at the interfaces between the polished surfaces of the integrated main insulator and the respective opposing faces of the electrode and the inner wall of the sealed enclosure. These face seals are positioned substantially concentrically surround the holes through the integral feedthrough insulators, thereby sealing against gas leaks. The face seals preferably sit in grooves in the electrode and the inner wall of the sealed enclosure. The face seals preferably are tin-plated copper-nickel substrate "C"-seals. Advantageously, these face seals slide compliantly over the polished surfaces of the integrated main insulator, accommodating differential thermal expansion over a temperature range extending to 100° C. above ambient without loss of integrity.

In some preferred embodiments where extensive thermal cycling is expected the three seals at both ends of main insulator are comprised of seals comprised of fluorinated polymer such as Viton rubber which is more accommodating to relative expansion and contracting than the ten-cooled metal seals. Other alternative design modifications to accommodate extensive thermal cycling include:

1. Use of combination bellows seal-C-seal at least on the three-end feed through.
2. Eliminate the three feedthroughs at each end.
3. Double seal with polymer seal and a tin-cooled meat seal sealing the polymer seal at least for the three-end feedthrough.
4. Other techniques for capture of the polymer.
5. Use of indium, lead copper seals.
6. Ion implant a metal washer on main insulator parts.
7. Soldered bellows seal.
8. Move seal inside of metal.
9. A racetrack seal around all the feedthroughs.
10. Dovetail grove.
11. Steel upper.
12. Monel plate that fits in with the feedthroughs.
13. Arc spray metal-coated on ceramic.
14. Providing a central sliding joint with anti-tracking grooves in insulator.

BRIEF DESCRIPTION OF THE DRAWINGS

The present invention may be better understood, and it's numerous objects, features, and advantages made apparent to those skilled in the art by referencing the accompanying drawings. For simplicity and ease of understanding, common numbering of elements within the illustrations is employed where an element is the same in different drawings.

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent. These descriptions and drawings are not to be considered in a limiting sense as it is understood that the present invention is in no way limited to the embodiments illustrated.

Figure 2:
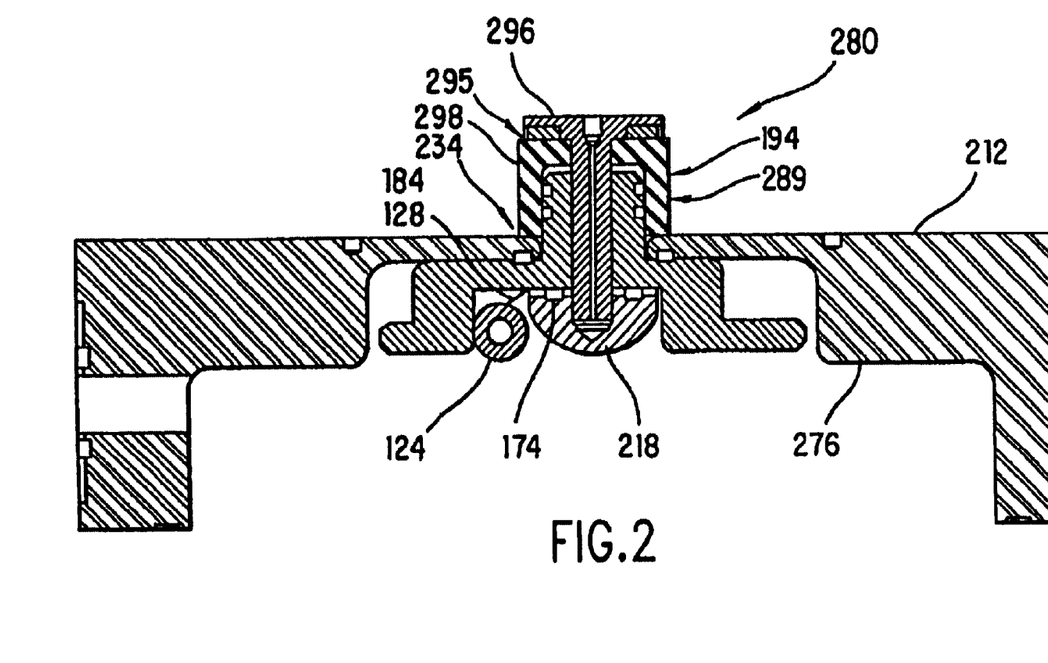
FIG. 2 is a cross-sectional view showing a portion of an upper enclosure member attached to a cathode assembly including an improved feedthrough structure, in accordance with the present invention.
Figure 3:
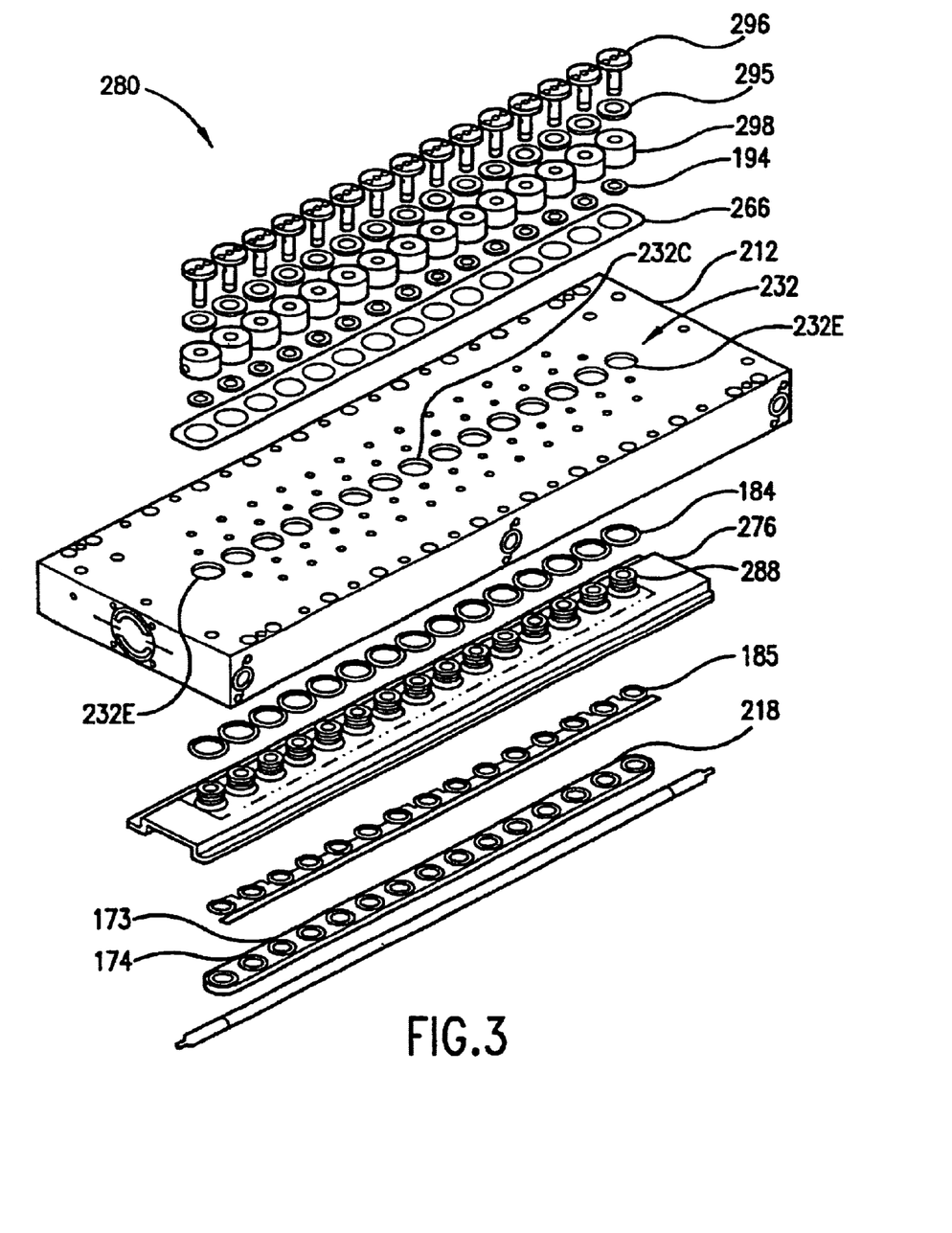
FIG. 3 is an exploded perspective view showing the components of the improved cathode assembly of FIG. 2.

FIG. 2 is a cross-sectional view showing a portion of an upper enclosure member 212 to which is attached cathode assembly 218 including an improved feedthrough structure 280, in accordance with the present invention. FIG. 3 is an exploded perspective view showing the components of feedthrough structure 280 and upper enclosure 212. Among other things, feedthrough structure features a single piece integrated main insulator 276 including self-contained integral feedthrough insulators 288 and polished sealing surfaces. Upper enclosure member 212 includes fifteen clearance holes 232 that are shaped, such that structural alignment is maintained without constraining thermal expansion. Sliding face seals 184, 185 are set into properly dimensioned grooves 234 in the inside surface of upper enclosure 212 (see FIG. 2 and FIG. 5) and grooves 174 in the top of electrodes 218 (see FIG. 2). These seals provide gas-tight integrity without transmitting torque within feedthrough structure 280, since they slip on polished surfaces of main insulator 276. Seals 184 and 185 are preferably tin coated Inconel®-718.

Figure 4:
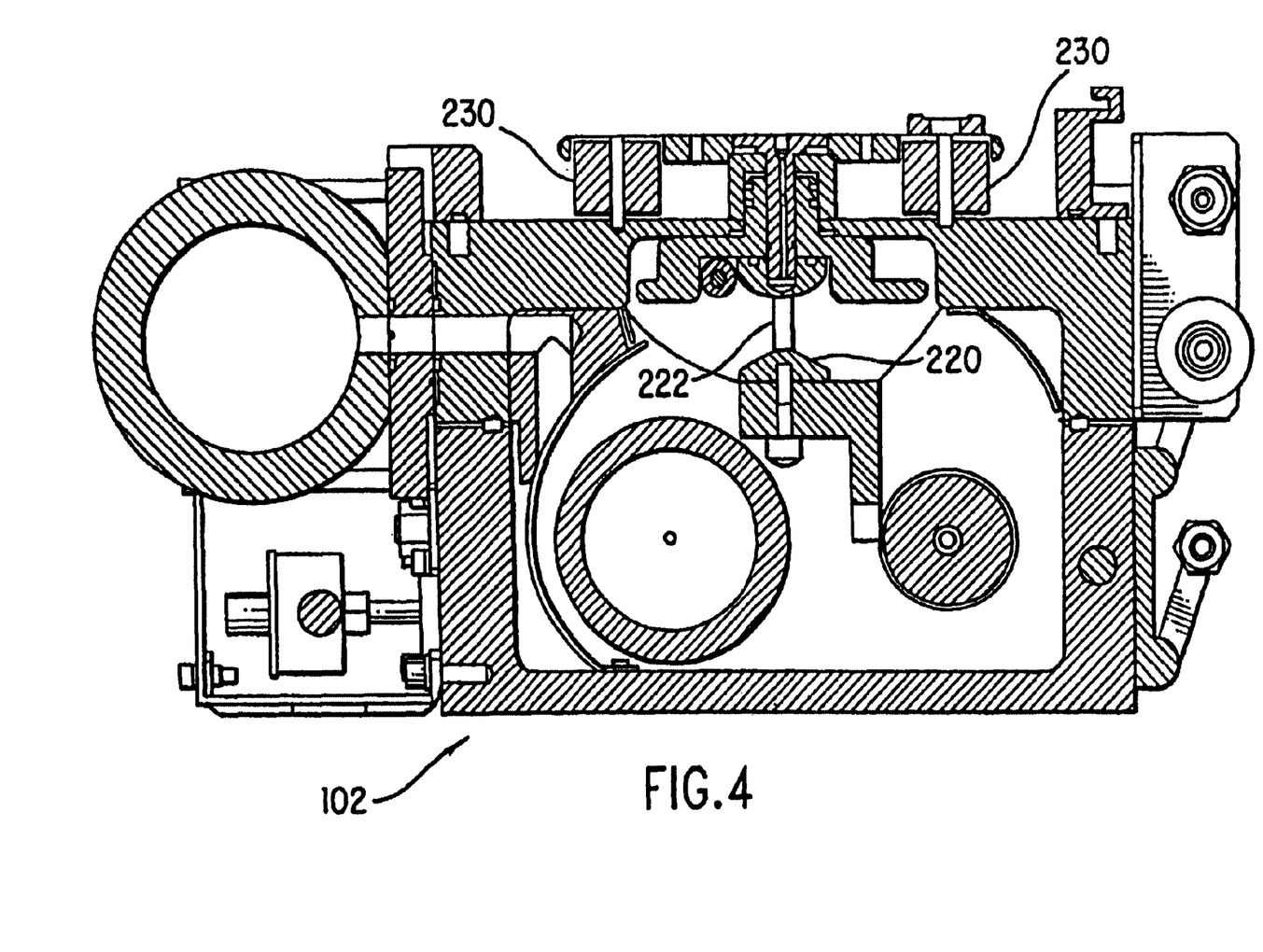
FIG. 4 is a cross section of a laser chamber utilizing its improved feedthrough structure.

A cathode 218, made of brass is fastened to an upper enclosure member 212 using feedthrough structure 280, such that cathode 218 is positioned above and aligned longitudinally parallel with an anode assembly 220 (shown in FIG. 4) across a discharge region 222. Along the centerline of the upper surface of cathode 218 are fifteen of substantially identical evenly spaced blind tapped holes 173, as in FIG. 3. Concentric with each of tapped holes 173 is annular groove 174.

Feedthrough structure 280 provides mechanical support, high pulse voltage electrical contact, and electrical isolation for cathode 218, as well as sealing against gas leakage around the electrical feedthroughs. Feedthrough structure 280 includes a shaped, longitudinally extended single piece integrated main insulator 276, generally made of alumina, having a single row of multiple substantially evenly spaced vertical holes concentric through substantially cylindrical integral feedthrough insulators 288 extending perpendicular from an upper face of single piece integrated main insulator 276, in alignment with blind tapped holes 173 of cathode 170. Single piece integrated main insulator 276 is fabricated using methods known in the art, e.g., casting and machining "green" ceramic material, high-temperature firing, and then finish machining the fired ceramic. Both upper and lower faces of integrated main insulator 276 are polished, typically to a surface finish of 4–8 microinches (0.15 microns), providing improved sealing against cathode 218 and upper enclosure member 212. Integral feedthrough insulators 288 each have two outer concentric grooves 289 as shown in FIG. 2. Feedthrough structure 280 also includes multiple (one per each blind tapped hole 173 in cathode 28) threaded feedthrough bolts 296, large diameter and small diameter face seals 184 and 185 respectively comprising tin-plated "C"-seals. Feedthrough structure 280 further includes multiple silicone rubber gaskets 194, properly sized Belleville washers 295, and insulating ceramic "buttercups" 298. Feedthrough structure 280 additionally includes a gas purge shield 266 consisting of a flat polyamide or similar insulating strip, containing a single row of clearance holes in alignment with the fifteen blind tapped holes 173 in cathode 218.

As illustrated in FIG. 2, a small diameter face seal 185 is inserted into each concentric annular groove 174 in cathode 218. Integrated main insulator 276 is aligned with blind tapped holes 173 and is seated onto face seals 185 inserted into cathode 218.

Upper enclosure member 212, preferably made of aluminum, has a single row of fifteen clearance holes 232 through its top wall in substantially aligned with blind tapped holes 173 of cathode 218. On the inner face of upper enclosure member 212 concentric with each clearance hole is an annular groove 234 (shown in FIG. 2). A large diameter face seal 184 is inserted into each annular groove 234 of upper enclosure member 212. Upper enclosure member 212 is aligned and seated over integral feedthrough insulators 288. Gas purge shield 266 is aligned and seated over integral feedthrough insulators 288 onto the outer face of upper enclosure member 212 as indicated in FIG. 3. A silicone rubber gasket 194 is positioned concentrically on top of each integral feedthrough insulator 288. A "buttercup" 298 is slidably installed over each integral feedthrough insulator 288, and a brass feedthrough bolt 296 with a steel Belleville washer 295 is inserted through a clearance hole in each "buttercup" 298 and through integral feedthrough insulator 288 into blind tapped hole 173. Feedthrough bolts 296 are engaged and tightened into blind tapped holes 173 of cathode 174 using a tightening torque of approximately 200 inch-lbs (2.3 kg-meters). This torque is sufficient to compress the Belleville washer sufficiently to produce a force per bolt of about 2,400 pounds. Thus the total compression of the enclosure, main insulator cathode sandwich is about 36,000 pounds. The outer flange of feedthrough bolts 296 are electrically connected with the high voltage side of a pulse high voltage capacitor bank 230 and serve as feedthrough electrical conductors to cathode 218.

Adjacent to cathode 218 is a preionizer tube 124, which extends substantially parallel to cathode 218 for almost all of the length of laser enclosure 102 and assists in initiating the pulsed electric discharge by creating a high instantaneous electric field. A preionizer rod is made of electrically conductive material, commonly brass and is inserted longitudinally into a tube made of an electrically insulating material. A high instantaneous electric field created by preionizer tube 124 and an electrically conductive shim 128, typically made of a thin sheet of brass and extending transversely from and electrically connected to cathode 218. A long thin edge of shim 128 presses against the side of preionizer rod to produce a very high electric field and a corona discharge around the preionizer just prior to peak voltage during each pulse.

Figure 5:
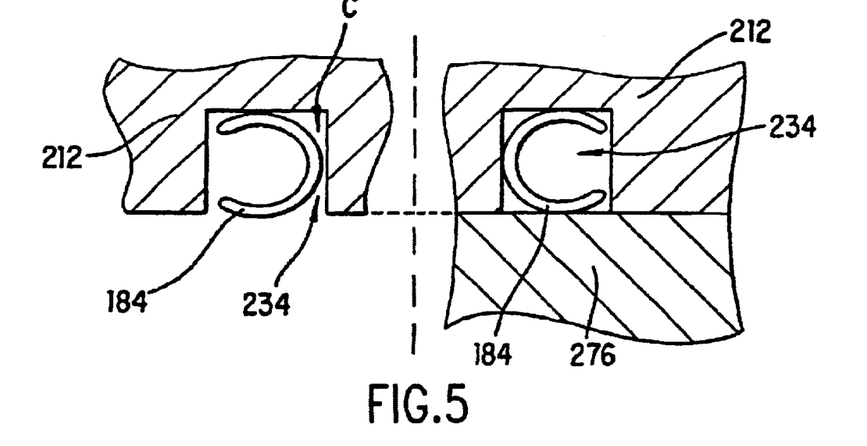
FIG. 5 is a cross sectional view demonstrating the function of a face seal.

FIG. 5 is a split cross-sectional view illustrating the proper dimensioning of annular groove 234 in upper enclosure member 212 relative to face seal 184. In the left hand portion of FIG. 5 is shown a section of face seal 184 in annular groove 234 with the opposing upper face of single piece integrated main insulator 276 removed. It will be noted that, unlike interference A shown in FIG. 5, there is a clearance C between the inside diameters of face seal 184 and annular groove 234 respectively. In the right hand portion of FIG. 5, face seal 184 is shown compressed between annular groove 234 and opposing upper face of single piece integrated main insulator 276. The compressive constraints do not cause distortion of the inside diameter of face seal 184, preserving the integrity of the seal and protecting "C"-seal 184 against material fatigue failure.

The present invention provides important improvements over prior art feedthrough designs. The number of individual parts is reduced. Assembly and processing time and effort are reduced. This is facilitated by the bolt torque procedure described above. Interconnecting part stack-ups are reduced. In the worst case accumulated vertical tolerance stack-up, the vertical clearance variation between integral feedthrough insulator 288 and "buttercup" 298 is only 0.012 inch (0.30 mm).

Single piece integrated main insulator 276 includes self-contained integral feedthrough insulators 288, replacing the complex individual feedthrough insulators such as insulator 41 shown in FIG. 1A. This eliminates the problematic similar material sliding interface between insulators 41 and 28 as shown in FIG. 1A. The integrated insulator also eliminates the need for an anti-corona gasket at the interface.

Figure 6:
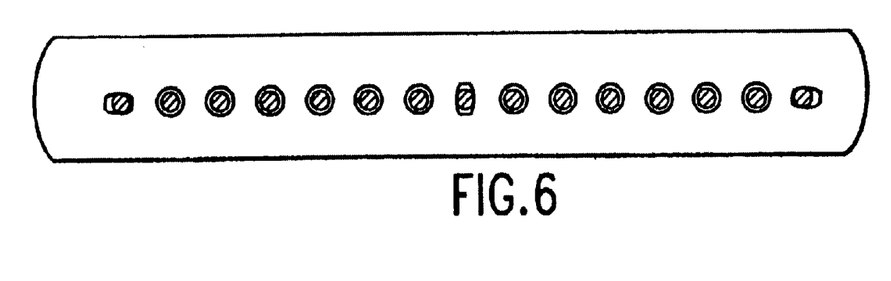
FIG. 6 is a drawing showing the general shape of feedthrough holes in a single piece insulator.

A center longitudinal datum is established, minimizing longitudinal tolerance accumulation and overall longitudinal differential thermal expansion. The center clearance hole 232C in upper enclosure member 212 also provides a physical positional locator, from which all parts are dimensioned and toleranced. Worst case clearance at center hole 232 is 0.0020 inch (0.051 mm). This allows precise tolerancing and positioning of other features of feedthrough structure 280. Worst case required longitudinal clearance at the end clearance hole 232E in upper enclosure member 212 is 0.0130 inch (0.33 mm), and between "buttercup" 298 and integral feedthrough insulator 288 is 0.0135 inch (0.343 mm). End clearance holes 232E in upper enclosure member 212 are ovally elongated longitudinally, thereby providing lateral structural alignment while permitting longitudinal differential expansion. Clearance holes 232 located longitudinally between the center and ends in upper enclosure member 212 are symmetrically radially enlarged, thereby accommodating both longitudinal and lateral relative motions without overconstraint. Compressive force of about 36,000 pounds provided by compressive Belleville washers 295 permit main insulator 276 to slide relative to enclosure 212 and electrode 218 in response to thermal stresses. The diameter of twelve of the bolt holes through insulator 276 as with enclosure 212 is chosen to be large enough to permit thermal expansion and contraction of the insulator without interference. As shown in FIG. 6, the center hole provides a tight fit (similar to enclosure 212) for the bolt in the laser axial direction, but the hole is enlarged in the direction perpendicular to axial to allow some small movement in that perpendicular direction. The two end holes provide a tight fit in the perpendicular direction but are enlarged in the axial direction. This arrangement forces the insulator to expand and contract relative to the cathode 218 and enclosure 212 from the axial center of the electrode and the insulator. The two end holes aligns the insulator relative to the cathode in the perpendicular direction. Thus the main insulator 276 is effectively completely restrained between enclosure 212 and electrode 218 at only one point, i.e., at the center hole 232C in enclosure 212.

Use of aluminum in upper enclosure member 212 provides a close thermal expansion match to brass cathode 174. Although very slight bending of feedthrough bolt 296 occurs under differential thermal expansion, this bending is accommodated by enlarged clearance holes through integral feedthrough insulator 288. Face seals 184, 185, being tin-plated "C"-seals, have a low coefficient of friction and readily slide without failure or loss of seal across their respective opposing polished alumina surfaces of single piece integrated main insulator 276. Applicants have confirmed the integrity of the design through thermal cycling exceeding expected lifetime cycling.

The compliant feedthrough apparatus and method above accommodate repeated thermal expansions and contractions over temperature range to 100° C. above ambient. Thereby the above-described embodiments provide an improved apparatus and method of mechanically supporting, conducting high voltage pulsed electric power, electrically, isolating, and sealing against gas leakage a structure substantially surrounded by a closed chamber, particularly a structure including an electrode. Such an electrode can be a cathode of an electric discharge laser, more particularly of a krypton fluoride or argon fluoride excimer laser, or of a fluorine ($F_2$) molecular gas laser.

Extensive Thermal Cycling

The embodiment described above has been utilized in many laser systems operating for many thousands of hours without problems. However, Applicants have discovered seal failure (primarily in seals sealing the three end feedthroughs at each end of the cathode) where the feedthrough seals have been exposed to extensive thermal cycling. After many such cycles the tin coating of the seals wears away which causes the seals to leak. Applicants have developed several preferred solutions to this issue. One solution (simply) is to avoid the thermal cycling. This means once the laser is heated up to its operating temperature of about 55° C., that it be kept warm throughout chamber life or that the number of cooldowns be minimized. This is often feasible since chamber life in terms of calendar time is relatively short, i.e. typically about 3–6 months and since the lasers operate typically around-the-clock 365 days a year. Several other solutions are described below:

Fluorinated Elastomer Seals

Elastomer seals are well known and many such seals are extensively used. These seals are typically flexible and can withstand substantial thermal cycling with differential expansion of the sealed surfaces without seal failure. However, typical elastomer seals cannot be used effectively in a fluorine atmosphere because the fluorine reacts with the polymer and relatively quickly produces seal failure. Also, the chemical reaction products tend to contaminate the environment. Applicants have discovered however that there are a few elastomer seals that can be used effectively in a fluorine environment such as an excimer laser chambers.

One such products is a seal made from a Dupont-Dow chemical product called Viton®. Viton® is a polymer material comprised of CaO, MgO in a fluorinated polymer structure. In this chemical structure most of the hydrogen atoms have been replaced with fluorine. The CaO and MgO are referred to as fillers and provide special mechanical properties. These Viton seals are available commercially from several suppliers such as Dupont Dow Elastomers and Parker Hannifin Corporation. Fluorinated polymer seals are sometimes referred to as "fluro "rubber seals and Viton® seals.

These fluorinated polymer seals are greatly preferred for use in these excimer laser fluorine environments as compared to typical polymer seals. However, the fluorinated polymer seals are not as compatible with fluorine as the tin coated metal seals described above. Therefore, where differential thermal expansion is not an issue, the metal seals are preferable to the fluorinated polymer seals.

For all the above reasons, Applicants have through their experiments, tests and operating experience determined that a preferred seal arrangement for the single piece insulator shown in FIG. 3 is to use tin-coated Inconnel c-seals for the middle seven seals (184 in FIG. 3) and fluorinated polymer seals for the four seals at each end of the structure. Applicants' preference for the fluorinated polymer seals is a fluorinated polymer seal made by Parker Hannifin. The material for these seals are identified as material No. V0747-75.

Bellows Seal C-Seal Combination

Figure 7:
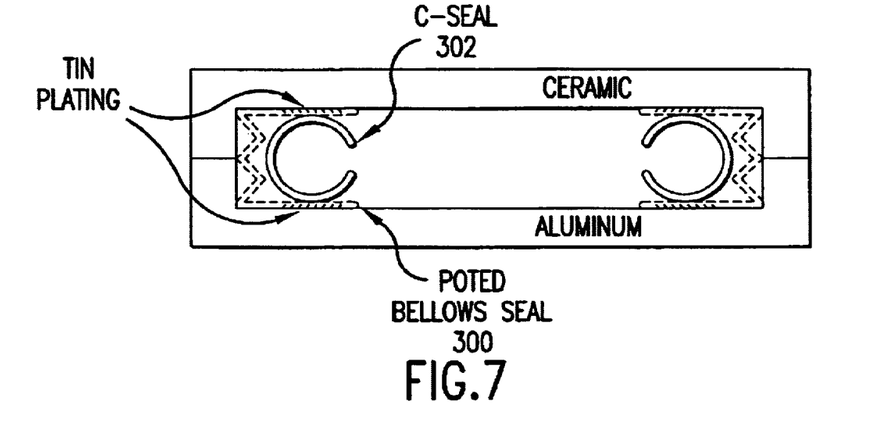
FIGS. 7, 8, and 9 show preferred sealing techniques.

FIG. 7 shows a design of a combination bellows useful for sealing feedthroughs where significant differential thermal expansion and contraction is expected. For example, in a preferred embodiment theses seals are utilized for the three feedthroughs at each end of the line of feedthroughs shows in FIG. 3.

The bellows type seal can tolerate thermally induced sliding, but it can not generate the force required to accomplish a tin seal in our application. Conversely, the c-seal 302 can generate the required sealing force but can not tolerate the sliding. This invention combines the best features of both seal types. As illustrated in FIG. 7, tight counterbores in both the ceramic and aluminum sealing surfaces restrict the motion of the tin-plated bellows seal. No sliding is accommodated. An unplated c-seal is used to load the bellows seal to accomplish a leak tight interface. Any sliding that results from differential thermal expansion between the ceramic and the aluminum is manifested between the c-seal and the bellows seal. This is not a sealing surface, so the combined interface remains gas tight.

Eliminate Three End Feedthroughs

Another solution to the problem of the seal failures on the three end feedthroughs is to eliminate the three end feedthroughs at both ends of the cathodes. This would leave nine feedthroughs evenly spaced over the central 12 inches of the 21.5 inch cathode. This will produce a slight increase in the inductance in the final loop of the pulse power circuit for the laser system. However, Applicants have determined that this is not a significant problem and actually may improve the electrical performance of the pulse power system. Also, Applicants have noticed a slight increase in electrode erosion near the ends of the electrodes. Thus, the elimination of these six feedthroughs could also help even-out electrode erosion. As explained above the main insulator is pinned to the chamber upper at a point near its central point. Eliminating the three end feedthroughs at each end means in preferred embodiments that the maximum distance of the feedthrough from a pinned central point is only about 6 inches as compared to about 10¼ inches.

Double Seal

Figure 8:
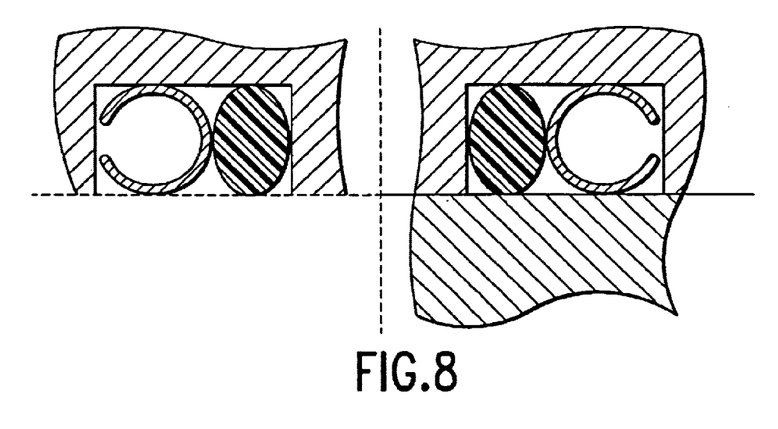

A double seal is shown in FIG. 8. Here the feedthrough is sealed with a tin-coated c-seal 304 and an viton o-ring 306. The viton o-ring is subject to attack by fluorine gas in the chamber but any deterioration of the viton o-ring is a relatively slow process, especially if the fluorine concentration is very low. In this particular design both seals protect the feedthrough passageway at the beginning of the chamber life. If the c-seal fails due to thermal cycling, the o-ring provides a backup. Since leakage through a failed c-seal is expected to be very minute, Applicants expect that any resulting deterioration of the o-ring (due to the leaking c-seal) is expected to be so low that the double seal will not be a chamber life limiting item. This combination could be applied to all feedthroughs; however, Applicants prefer to use the combination only on the end-three feedthroughs.

Indium, Lead Copper Seals

Applicants has had excellent experience with tin-cooled metal seals except for the end-three end feedthroughs. One method providing for additional thermal expansion and contraction at these locations is to use indium lead copper seals which are available from suppliers such as Perlon-Elmer or AIM Specialty Solders, Germany. These seals are more resilient and are expected to remain effective for substantially longer time than the tin-coated c-seals. (PUI Inc., Oxnard, Calif.).

Ion Implanted or Arc Spray Washer on Main Insulator

The primary cause of failure of the tin-coated c-seals is wear against the main insulator surface. Since it is ceramic, at the microscope dimension the surface is very rough even after efforts to provide a smooth polished surface. Another solution the seal failure problem is to implant a metal surface on the portion of the insulator in contact with the seal. A layer of a few microns would be sufficient. Preferred materials are tin or gold. The metal surface is then polished smooth.

Faraday Cage for Feedthrough Seals

Another advantage of the metal "washer" on the main insulator is that it will shield polymeric seals from plasmas. Applicants' visual inspection of the polymeric seals placed in operating laser chamber reveals aggressive attack of the seal by plasma fluorine. There corrosion attack of the chamber components via hollow cathode discharges can be eliminated by placing a conductive a shield (at ground potential) to reduce or eliminate stray electric fields. This technique is commonly used in dry etch and CVD systems to protect chamber components to plasma attack.

Elimination of the parasitic glow near a polymeric HV feedthrough seal will a) improve o-ring life, b) reduce gas contamination resulting from o-ring polymer outgassing during plasma decomposition, c) improve energy stability by eliminating random parasitic glow discharges in the power delivery circuit to the cathode, and d) increase voltage overhead to the chamber by reducing operating voltage via elimination of parasitic glow (voltage is applied directly to anode/cathode discharge), vs. A/C pair plus parasitic glow.

Figure 10:
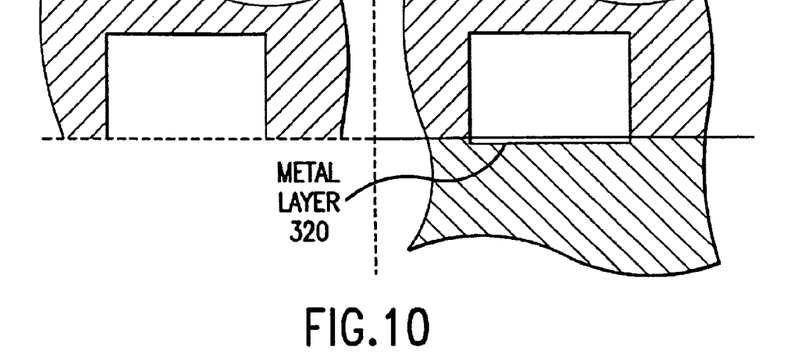
FIG. 10 shows a technique for segmenting the main insulator.

By depositing a conductive layer on the back on the main insulator of the laser chamber around the HV feeds (circle 1.5 inches in diameter), on can create a faraday cage as shown at 320 in FIG. 10. The seal will be placed on the Faraday coating. During assembly of the chamber, the upper of the chamber will press against the metal coating, creating a connection to ground. Therefore, the coating will be at ground potential, and the seal will be resting an are devoid of stray e-field. This is a simple coating modification to the main insulator and can even improve the ability to improve the ability to polish the main insulator. Applicants prefer using a twin wire arc sprayed coating for this application, either Cu or Al, nickel can also be used.

Separating Main Insulator

Figure 11:
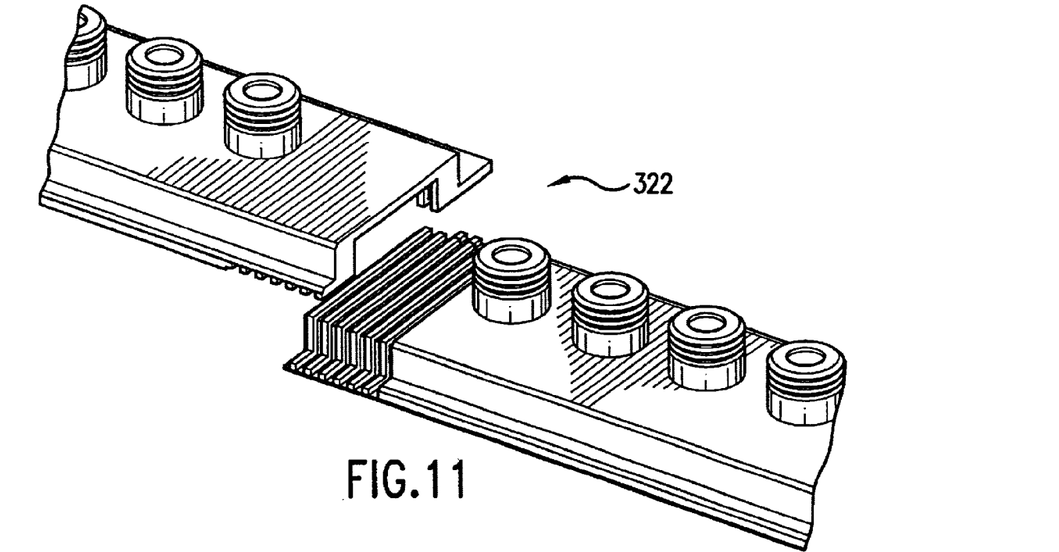
FIG. 11 shows a two-piece main insulator.

A potential solution to minimize differential thermal expansion is to separate the one-piece main insulator into two sections each of which would be pinned to the chamber upper at the center of the section. The central feedthrough would be eliminated to permit anti-tracking grooves at 322 to be provided as shown in FIG. 11 at the junction between the two sections of the main insulator. Note the anti-tracking grooves are designed so as to permit relative expansion and contraction between two portions.

Dovetail Grove

Figure 9:
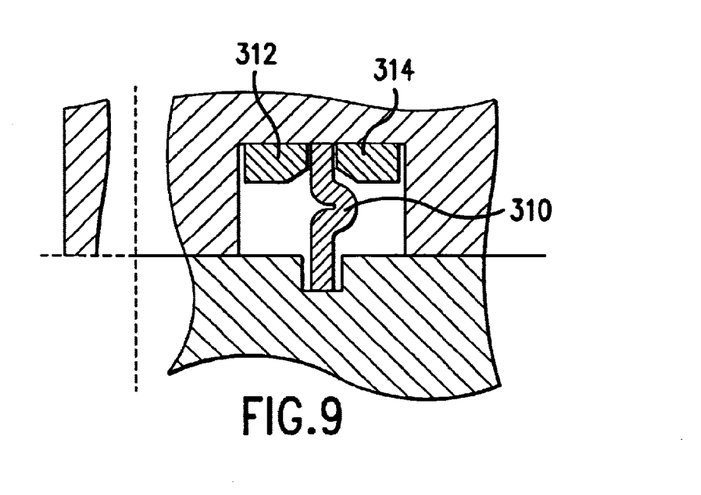

Another preferred sealing technique is shown in FIG. 9. Here a bellows type seal 310 is locked into a groove in the main insulator. Spacer rings 312 and 314 provide a slot for the bellows seal in the chamber upper permitting use of existing seal cups.

Other Solutions

Other techniques which can be used to minimize seal failure include use of a steel chamber upper instead of aluminum. This will help because the thermal expansion of steel is closer to that of the alumina main insulator. Another possibility would be to add a monel plate to the underside of the chamber upper to reduce the thermal expansion of the chamber upper.

Gasket Seals

Another solution seal failure between the chamber end the main insulator is to replace the c-seals with a gasket like the head gasket on automobiles. These gaskets have been utilized successfully for many years providing seals between engine heads and the engine block where the lead is sometimes made of aluminum and the block is made of steel.

Non-Sliding C-Seal

Figure 12:
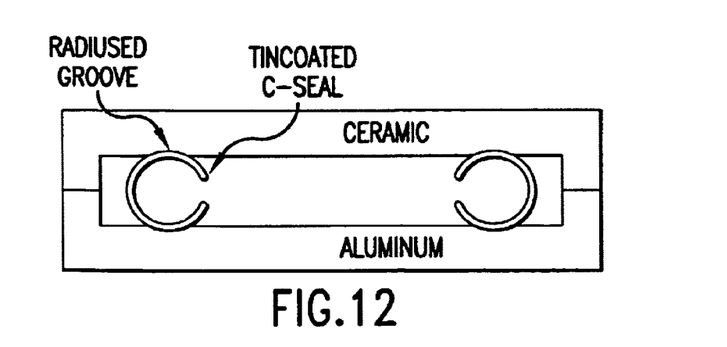
FIG. 12 shows a non-slip c-seal configuration.

Another preferred seal configuration is shown in FIG. 12. The failure mechanism for a standard C-seal, in a flat, plane cavity, when subjected to differential thermal movement is the eroding of the tin plating when the seal rubs (slides) on the mating surface. This invention suggests diminishing, if not eliminating, this sliding by holding the seal in a pair of radiused grooves in the two mating surfaces. In this way, when the mating surfaces move in a shear direction with respect to each other, the seal will tend to compress in the horizontal plane, accommodating the movement without sliding. The line of contact (the seal dam area) between the seal and the mating surface with tend to move up the radiused groove, but should do so with more a rolling action then a sliding action, thus preserving the tin in the seal area.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus for conducting high electric power through the wall of a sealed chamber of an electric discharge laser to an elongated electrode inside the chamber, defining an electrode length, comprising:
    a single piece main insulator of an electrically insulating material larger than said electrode length, said main insulator comprising:
        A) a first polished substantially planar surface portion and a second polished substantially planar surface portion substantially parallel to said first polished substantially planar surface portion; and
        B) a plurality of substantially cylindrical feedthrough insulator portions integral with said single piece main insulator and extending from said first polished substantially planar surface portion;
    wherein a substantially cylindrical hole extends substantially coaxially through each of said cylindrical feedthrough insulator portions and through said first and said second polished substantially planar surface portions;
        C) a sealing means for sealing each of said substantially cylindrical holes.

2. The apparatus as in claim 1 wherein said sealing means comprises a bellows seal and a c-seal combination.

3. The apparatus as in claim 1 wherein said single piece main insulator defines a central point and is pinned to said chamber at a point near said central point and said feedthrough insulator portions are confined to within 6 inches of said central point.

4. The apparatus as in claim 1 wherein said sealing means comprises a double seals at at least four of said cylindrical holes.

5. The apparatus as in claim 4 wherein each of said double seals comprise a coated metal seal and a polymeric seal.

6. The apparatus as in claim 1 wherein said sealing means comprises indium, lead copper seals.

7. The apparatus as in claim 1 wherein said sealing means comprises a plurality of metal layers deposited on said single piece main insulator at locations of said feedthrough portions.

8. The apparatus as in claim 7 wherein said metal layers in combination with slots in said wall of said chamber provides a Faraday Cage for seals confined in said slots.

9. The apparatus as in claim 1 wherein said seal means comprises a gasket seal.

10. The apparatus as in claim 1 wherein said seals means comprises a bellows type seal confined in a dovetail grove.

11. The apparatus of claim 1, wherein said first and said second polished substantially planar surface portions have a surface finish of approximately 8–16 microinches.

12. The apparatus of claim 1, wherein said electrically insulating material is alumina ceramic having a purity greater than approximately 99.5 percent.

13. The apparatus of claim 5, wherein the composition of said face seal is dissimilar from said electrically insulating material.

14. The apparatus of claim 13, wherein said composition is tin-plating on a nickel-copper alloy substrate.

15. The apparatus as in claim 1, wherein said sealing means comprises at least one c-seal retained in a radiused groove.

16. The apparatus as in claim 15, wherein said at least one c-seal is in a tin-coated metal c-seal.

17. The apparatus of claim 1, further comprising:
    at least one feedthrough electrical conductor disposed substantially coaxially through said substantially cylindrical hole; and
    an electrode connected to said feedthrough electrical conductor, said electrode disposed adjacent said second polished substantially planar surface portion.

18. The apparatus of claim 9, wherein said electrode is a cathode.

19. The apparatus of claim 1, wherein said electric discharge laser is selected from a group consisting of argon fluoride excimer lasers, krypton fluoride excimer lasers, and fluorine ($F_2$) molecular lasers.

20. An apparatus for conducting high electric power through the wall of a sealed chamber of an electric discharge laser to an elongated electrode inside the chamber, defining an electrode length, comprising:
    a two piece main insulator of an electrically insulating material larger than said electrode length, said main insulator comprising a first piece and second piece each of said first piece and said second piece comprising:

a) a first polished substantially planar surface portion and a second polished substantially planar surface portion substantially parallel to said first polished substantially planar surface portion; and b) a plurality of substantially cylindrical feedthrough insulator portions integral with said first piece and said second piece, respectively and extending from said first polished substantially planar surface portion on each of said first piece and said second piece, respectively;

wherein a substantially cylindrical hole extends substantially coaxially through said each of said cylindrical feedthrough insulator portions and through said first and said second polished substantially planar surface portions, wherein each of said first piece and said second piece is pinned to said wall near a central portion of said first piece and said second piece, respectively, and wherein each of said first pieces and said second piece comprises anti-tracking groves interlocked with each other.

* * * * *